3,499,805

PROCESS FOR DEEP ETCHING A SILICON WAFER

Charles G. Brooks, Baltimore, Md., assignor, by mesne assignments, to the United States of America as represented by the Secretary of the Air Force No Drawing. Filed Aug. 29, 1966, Ser. No. 576,200
Int. Cl. C23f *1/02;* C23b *3/04*
U.S. Cl. 156—13 1 Claim

ABSTRACT OF THE DISCLOSURE

In a process for deep etching silicon wafers, a thin sheet of lens paper is cut to form the desired etch pattern. The paper is then immersed in a solution of Apiezon wax and trichloroethylene and permitted to become saturated with the solution. The saturated paper is placed on the silicon wafer and then exposed to air to permit the trichloroethylene to vaporize. The coated wafer is then heated to soften the wax to provide intimate contact between the wafer and the impregnated paper. After cooling, an etchant is applied to the mask on the wafer to etch the silicon to the desired depth.

The invention relates to a new and improved deep etch mask process for precisely and accurately etching a desired depth of area pattern on a silicon wafer.

In the past, a photographic process using photographic etching action resisting materials or resists, for confining the etchant action to within a prescribed surface area and pattern on the silicon wafer, has been used in etching the silicon to a usual depth of .001 inch.

The object of the present invention is to provide a process and a resist that are adapted for accomplishing a deep or a through thickness etch in excess of the .001 inch of the photographic etch such that an etch of .007 inch penetration into the silicon may be accomplished.

Many resists available for photographic etching for shielding the surface of the silicon wafer outside of the area intended to be etched have been tried for extended etching times and have deteriorated and have permitted the action of the etchant to depart from the area limitations and from the design contour of the pattern to be etched.

The present invention provides a resist that retains its integrity for extended etching operations without deterioration, that attains and retains its firm, tight and continuous bond to the surface of the silicon wafer to which it is attached throughout an extended etching operation and to the processes for making the resist and for using the resist applied to a silicon wafer.

The problem that is successfully solved hereby is to construct an etchant-resist mask that can be depended upon to be closely, continuously and strongly adherent to the surface to which it is applied throughout an extended etching operation and that successfully retains its structural identity and its chemically inert characteristic under the environmental conditions to which it is subjected during the etching process.

The mask that is disclosed hereby comprises a thin layer of cellulose mat material that is substantially completely saturated with Apiezon wax.

The mask that is disclosed herein preferably, and illustratively, is made of common lens paper, cut out to provide the desired mask form pattern on a drafting table or the like in the same manner in which ruby-lith photographic masks are now cut out.

The cut out lens paper is then immersed in a preferably saturated solution of Apiezon wax in trichloroethylene and is permitted to become saturated with the solution. The Apiezon wax saturated cut out lens paper is then removed from the solution and is applied to the silicon wafer where it is exposed to air for permitting the vaporization of the trichloroethylene solvent which has a boiling point of 87° C. at 760 millimeters of mercury.

The vaporization of the trichloroethylene solvent leaves the formed mask of Apiezon wax resting on the silicon wafer. The mask bearing wafer is then exposed to a heat source such, for example, as a conventional hot plate, for causing the softening and the intimate contact between the mask and the underlying surface of the silicon wafer such that there is an adhesive bond that is firmly and uninterruptedly established therebetween.

Upon cooling, the mask is closely and continuously adherent to the silicon wafer. A desired etchant such as a mixture of ammonium fluoride in hydrofluoric acid or the like may then be applied to the opening in the mask defining its pattern and is permitted to etch its way down into the silicon wafer to a desired distance with the silicon converted into gaseous silicon tetrafluoride that removes itself fom the reaction as a vapor, since silicon tetrafluoride boils at −86° C.

It is to be understood that limited equivalent materials, reactants and comparable process steps may be substituted for those disclosed herein without departing from the spirit and the scope of the present invention.

I claim:

1. The process for deep etching a silicon wafer, comprising the steps of:
   - cutting an opening in a thin sheet of lens paper to obtain the desired mask form;
   - immersing the lens paper in a solution of acid resistant wax and a low temperature vaporizable organic solvent to permit the paper to become impregnated and saturated with the solution;
   - applying the saturated paper to one surface of the silicon wafer;
   - exposing the silicon wafer and saturated paper to air to permit vaporization of the solvent;
   - applying heat to the wafer and saturated paper to soften the wax to provide an intimate adhesive bond between the impregnated paper and the silicon wafer;
   - permitting the wafer and impregnated paper to cool; and
   - applying an acid etchant to the opening in the mask formed on the wafer surface to etch the silicon wafer to the desired depth.

References Cited

UNITED STATES PATENTS

| | | | |
|---|---|---|---|
| 3,107,188 | 10/1963 | Hancock | 156—18 X |
| 3,128,213 | 4/1964 | Gault et al. | 156—17 |
| 3,226,255 | 12/1965 | Cieniewicz | 156—16 X |
| 3,250,637 | 5/1966 | Frasher et al. | 117—158 X |

HAROLD D. ANSHER, Primary Examiner

JOSEPH C. GILL, Assistant Examiner

U.S. Cl. X.R.

117—123, 158; 156—16, 17